(12) United States Patent
Kadasani et al.

(10) Patent No.: US 11,693,587 B2
(45) Date of Patent: Jul. 4, 2023

(54) SYSTEM DRIVEN PASS-THROUGH VOLTAGE ADJUSTMENT TO IMPROVE READ DISTURB IN MEMORY DEVICES

(71) Applicant: Micron Technology, Inc., Boise, ID (US)

(72) Inventors: Sandeep Reddy Kadasani, Meridian, ID (US); Scott Anthony Stoller, Boise, ID (US); Pitamber Shukla, Boise, ID (US); Niccolo' Righetti, Boise, ID (US); Chi Ming Chu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/404,875

(22) Filed: Aug. 17, 2021

(65) Prior Publication Data

US 2023/0058645 A1 Feb. 23, 2023

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004;
(Continued)

(56) References Cited

U.S. PATENT DOCUMENTS 7,916,547 B2 * 3/2011 Hosono .................. G11C 16/26
365/185.21
8,320,185 B2 * 11/2012 Marquart ........... G11C 16/0483
365/185.19
(Continued)

OTHER PUBLICATIONS

Jianwei Liao, Jun Li, Mingwang Zhao, Zhibing Sha, and Zhigang Cai. 2022. Read Refresh Scheduling and Data Reallocation against Read Disturb in SSDs. ACM Trans. Embed. Comput. Syst. 21, 2, Article 18 (Mar. 2022), 27 pages. https://doi.org/10.1145/3495254 (Year: 2022).*

(Continued)

*Primary Examiner* — Daniel C. Chappell
(74) *Attorney, Agent, or Firm* — Schwegman Lundberg & Woessner, P.A.

(57) ABSTRACT

A read operation is performed on a memory device in accordance with a pass-through voltage setting that defines a pass-through voltage applied to one or more cells of the memory device during read operations. A number of zero bits read from the memory device based on the read operation are counted and compared with a threshold value. Based on the number of zero bits exceeding the threshold value, the pass-through voltage is increased by adjusting the pass-through voltage setting.

20 Claims, 7 Drawing Sheets

(58) Field of Classification Search
CPC ........ G06F 2216/00–17; G06F 2221/00–2153;
G06K 9/00–6298; G06N 3/00–126; G06N
5/00–048; G06N 7/00–08; G06N 10/00;
G06N 20/00–20; G06N 99/00–007; G06T
1/00–60; G06V 30/00–43; G11B
20/00–24; G11B 33/00–1493; G11C
11/00–5692; G11C 13/00–06; G11C
14/00–009; G11C 15/00–06; G11C
16/00–3495; G11C 17/00–18; G11C
2207/00–229; G11C 2216/00–30; H01L
25/00–50; H01L 27/00–3293; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | | |
|---|---|---|---|---|
| 8,942,043 | B2* | 1/2015 | Yuan | G11C 16/0483 |
| | | | | 365/185.28 |
| 10,373,693 | B2* | 8/2019 | Cha | G06F 13/4068 |
| 10,586,602 | B2* | 3/2020 | Malshe | G11C 16/04 |
| 10,629,272 | B1* | 4/2020 | Lu | G11C 16/0483 |
| 10,691,377 | B2* | 6/2020 | Alsasua | G06F 3/0604 |
| 10,902,924 | B2* | 1/2021 | Park | G11C 16/24 |
| 11,086,719 | B2* | 8/2021 | Hassan | G06F 3/0659 |
| 2005/0270880 | A1* | 12/2005 | Hsu | G11C 11/4074 |
| | | | | 365/226 |
| 2006/0044872 | A1* | 3/2006 | Nazarian | G11C 16/0483 |
| | | | | 365/185.17 |
| 2006/0262602 | A1* | 11/2006 | Nazarian | G11C 16/0483 |
| | | | | 365/185.17 |
| 2008/0049507 | A1* | 2/2008 | Lee | G11C 16/3418 |
| | | | | 365/185.17 |
| 2009/0003078 | A1* | 1/2009 | Mihnea | G11C 16/3454 |
| | | | | 365/185.22 |
| 2009/0103371 | A1* | 4/2009 | Goda | G11C 16/3468 |
| | | | | 365/185.29 |
| 2010/0322007 | A1* | 12/2010 | Jeon | G11C 11/5642 |
| | | | | 365/185.18 |
| 2012/0063236 | A1* | 3/2012 | Hung | G11C 16/3427 |
| | | | | 365/185.24 |
| 2013/0262749 | A1* | 10/2013 | Oikawa | G06F 11/0793 |
| | | | | 711/E12.008 |
| 2016/0124876 | A1* | 5/2016 | Vucinic | G06F 3/0656 |
| | | | | 710/308 |
| 2016/0240262 | A1* | 8/2016 | Shah | G11C 16/34 |
| 2017/0076811 | A1* | 3/2017 | Reusswig | G11C 29/52 |
| 2018/0342305 | A1* | 11/2018 | Cha | G11C 16/3418 |
| 2019/0295660 | A1* | 9/2019 | Malshe | G11C 16/26 |
| 2022/0277798 | A1* | 9/2022 | Muchherla | G11C 16/26 |

OTHER PUBLICATIONS

Jun Li, Bowen Huang, Zhibing Sha, Zhigang Cai, Jianwei Liao, Balazs Gerofi, and Yutaka Ishikawa. 2020. Mitigating Negative Impacts of Read Disturb in SSDs. ACM Trans. Des. Autom. Electron. Syst. 26, 1, Article 3 (Jan. 2021), 24 pages. https://doi.org/10.1145/3410332 (Year: 2021).*

Seyedhamidreza Motaman and Swaroop Ghosh. 2014. Simultaneous Sizing, Reference Voltage and Clamp Voltage Biasing for Robustness, Self-Calibration and Testability of STTRAM Arrays. In Proceedings of the 51st Annual Design Automation Conference (DAC '14). Association for Computing Machinery. (Year: 2014).*

Solid State Drive Primer # 4—NAND Architecture—Pages & Blocks; Steve Larrivee; Mar. 30, 2015; retrieved from https://www.cactus-tech.com/resources/blog/details/solid-state-drive-primer-4-nand-architecture-pages-blocks/ on Jan. 20, 2023 (Year: 2015).*

* cited by examiner

SYSTEM DRIVEN PASS-THROUGH VOLTAGE ADJUSTMENT TO IMPROVE READ DISTURB IN MEMORY DEVICES

TECHNICAL FIELD

Embodiments of the disclosure relate generally to memory sub-systems and, more specifically, to a system driven pass-through voltage optimization to improve read disturb in memory devices.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
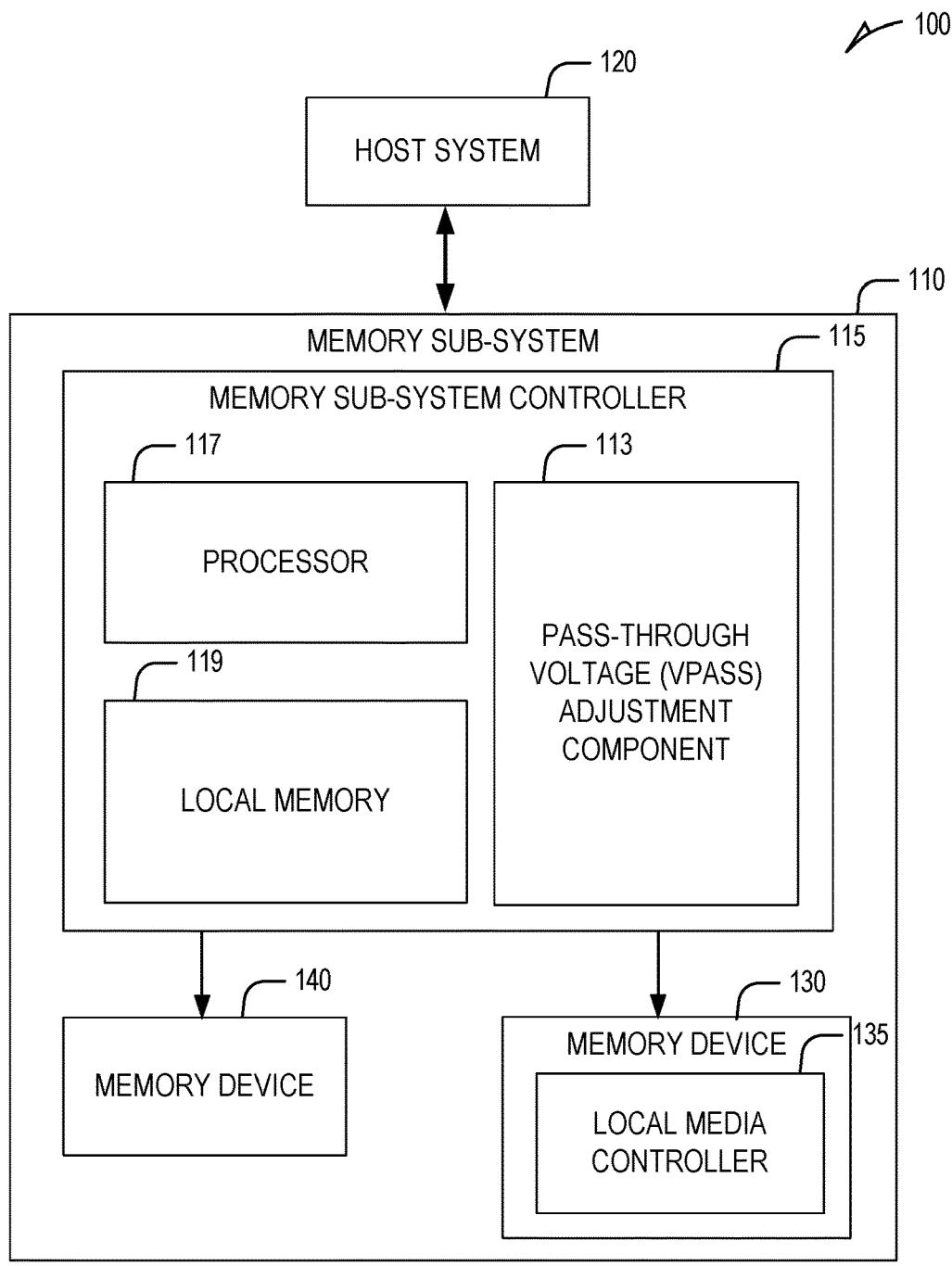
FIG. 1 is a block diagram illustrating an example computing environment that includes a memory sub-system, in accordance with some embodiments of the present disclosure.

Aspects of the present disclosure are directed to pass-through voltage adjustments for a memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

Some memory devices (e.g., NAND memory devices) include an array of memory cells (e.g., flash cells) to store data. Each cell includes a transistor and within each cell, data is stored as the threshold voltage of the transistor. During a read operation, a read reference voltage is applied to the transistor to determine a value of data stored by the transistor. Memory cells in these devices can be grouped as pages that can refer to a logical unit of the memory device used to store data. With some types of memory devices (e.g., NAND), pages are grouped to form blocks (also referred to herein as "memory blocks"). More specifically, within each block, cells can be arranged into 2D arrays with cells in the same row sharing a word line and cells in the same column being connected in series to form a bit line. All cells in a bit line share a common ground and a common sense amplifier on the other end for reading the threshold voltage of one of the cells when decoding data. Only one cell is read at a time per bit line and cells not being read must be kept on to allow the value from the cell being read to propagate to the sense amplifier. Accordingly, a pass-through voltage (also referred to herein as "VPASS") is applied to cells that are not being read. The pass-through voltage is a read reference voltage guaranteed to be higher than any stored threshold voltage.

NAND structures observe a unique intrinsic cell reliability degradation mechanism in which the pass-through voltage induces electric tunneling that can shift the threshold voltages of these unread cells to higher values, thereby disturbing cell contents on a read operation on neighboring cells. This is known as read disturb. Typically, the pass-through voltage is set at a fixed value (>8V) during manufacturing to ensure sufficient overdrive at end-of-life based on an estimated worst cycle degradation of the worst die. As a result, there is frequently excessive beginning-of-life read disturb caused by the pass-through voltage, which can be further exacerbated due to die-to-die variations.

Aspects of the present disclosure address the forgoing issues, among others, with a memory sub-system that optimizes pass-through voltage for a memory device using a feedback loop. The memory sub-system can optimize the pass-through voltage at time zero (i.e., at manufacturing), dynamically on the fly during operation in the field, or a combination of both. The optimizations to pass-through voltage can be done on a die-by-die basis to account for die-to-die variations.

In optimizing pass-through voltage for a memory device, an assessment is performed in which the pass-through voltage is applied to all word lines in a block during a read operation, and a number of zero bits read from the block is counted and compared with a threshold number of failing bits. If the number of zero bits exceeds the threshold number, the assessment fails. Otherwise, the assessment passes.

For optimizations performed at time zero, if the assessment passes, the memory sub-system decreases the pass-through voltage and the assessment is repeated. If the assessment fails, the memory sub-system reverts to the previous pass-through voltage, which is set as the pass-through voltage for the memory device. In essence, the memory sub-systems identifies the lowest pass-through voltage that results in a passing assessment, and that voltage is set as the pass-through voltage.

For on the fly dynamic optimizations, the assessment can be run at different program/erase cycles. If the assessment passes, the current pass-through voltage is maintained as the pass-through voltage. If the assessment fails, the pass-through voltage is increased to compensate for cycle degradation and the assessment is repeated.

In some embodiments, if a predetermined threshold number of consecutive passing assessments are reached, the memory sub-system can decrease the pass-through voltage. In embodiments in which the memory sub-system performs the on the fly optimizations without decreasing the pass-through voltage, an initial optimization is performed at time zero. In embodiments in which the memory sub-system is configured to decrease the pass-through voltage during dynamic operations, the memory sub-system may not perform an optimization at time zero.

Optimizing pass-through voltage for a memory device in the manners described herein, largely reduces read disturb in the memory device (e.g., 3× measured by L0 margin). Further, by improving read disturb in this way, the memory sub-system can reduce background scans and lower frequency of folding blocks to improve performance and Quality of service (QoS) of the memory device. In addition, the optimizations to pass-through voltage can reduce cache allocation in memory devices while also increasing reliability.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates example host system 120 that is coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 and 140 to perform operations such as reading data, writing data, or erasing data at the memory devices 130 and 140 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special-purpose logic circuitry (e.g., a field programmable gate array (FPGA), an application-specific integrated circuit (ASIC), etc.), or another suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory device 130 includes local media controller 135 that operates in conjunction with memory sub-system controller 115 to execute operations on one or more memory cells of the memory devices 130.

The memory sub-system 110 also includes a VPASS adjustment component 113 that is responsible for adjusting pass-through voltage settings that control pass-through voltages used in read operations at the memory devices 130 and 140. As previously noted, a pass-through voltage is applied to unread memory cells during a read operation. The VPASS adjustment component 113 uses a feedback loop to optimize pass-through voltage to reduce read disturb.

To optimize pass-through voltage for a memory device, the VPASS adjustment component 113 performs an assessment in which a voltage based on current pass-through voltage settings is applied to all word lines in a block of the memory device during a read operation. The VPASS adjustment component 113 counts a number of zero bits read from the block and compares the number with a threshold number of failing bits. The threshold number of failing bits can be based on a total page size of the memory device. If the number of zero bits exceeds the threshold number, the assessment fails. Otherwise, the assessment passes.

For optimizations performed at time zero, if the assessment passes, the VPASS adjustment component 113 decreases the pass-through voltage and the assessment is repeated. If the assessment fails, the VPASS adjustment component 113 sets the pass-through voltage according to a previous pass-through voltage setting. For on the fly dynamic optimizations, the assessment can be run at different program/erase cycles. If the assessment fails, the VPASS adjustment component 113 increases the pass-through voltage to compensate for cycle degradation and the assessment is repeated. If the assessment passes, the VPASS adjustment component 113 maintains the current pass-through voltage is as the pass-through voltage. In some embodiments, if a predetermined threshold number of consecutive passing assessments are reached, the VPASS adjustment component 113 can decrease the pass-through voltage.

In some embodiments, the memory sub-system controller 115 includes at least a portion of the VPASS adjustment component 113. For example, the memory sub-system controller 115 can include a processor 117 (processing device) configured to execute instructions stored in local memory 119 for performing the operations described herein. In some embodiments, at least a portion of the VPASS adjustment component 113 is part of the host system 120, an application, or an operating system. In some embodiments, the memory device 130 includes at least a portion of the VPASS adjustment 113. For example, as noted above, the memory device 130 includes the local media controller 135 that operates in conjunction with the memory sub-system controller 115 to execute operations on one or more memory cells of the memory devices 130.

Figure 2:
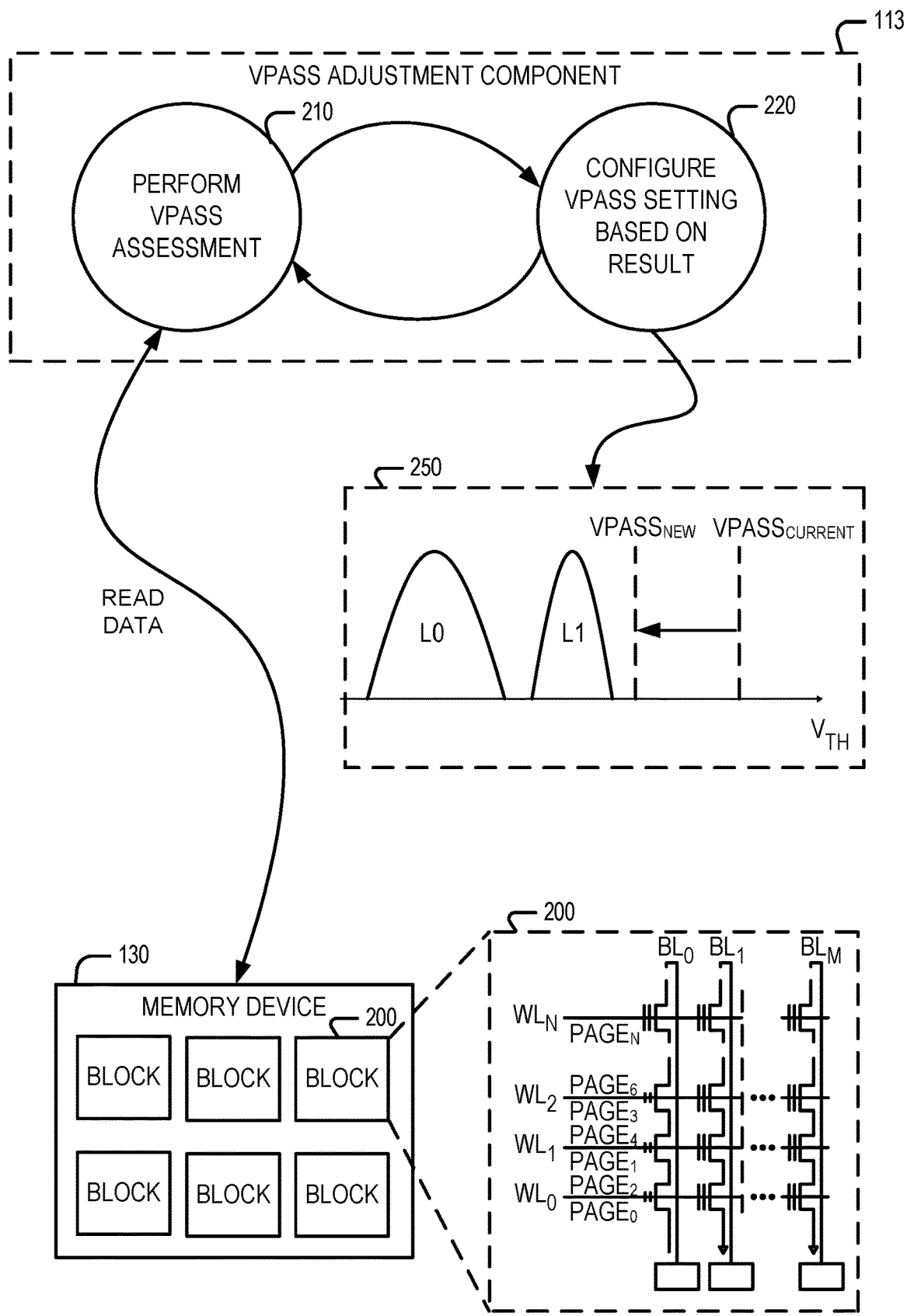
FIG. 2 is an interaction diagram illustrating example interactions between components of the memory sub-system in optimizing a pass-through voltage for a memory device, in accordance with some embodiments of the present disclosure.

FIG. 2 is an interaction diagram illustrating example interactions between components of the memory sub-system in optimizing a pass-through voltage for a memory device, in accordance with some embodiments of the present disclosure. In the example illustrated in FIG. 2 the memory device 130 is a NAND memory device that includes multiple memory blocks.

As shown, a NAND block 200 includes an array of pages (rows) and strings (columns). Each NAND cell includes a transistor, and within each cell, data is stored as the threshold voltage of the transistor. SLC NAND, for example, can store one bit per cell. Other types of memory cells, such as MLCs, TLCs, QLCs, and PLCs can store multiple bits per cell. Strings are connected within the NAND block 200 to allow storage and retrieval of data from selected cells. NAND cells in the same column are connected in series to form a bit line (BL). All cells in a bit line are connected to a common ground on one end and a common sense amplifier on the other for reading the threshold voltage of one of the cells when decoding data. NAND cells are connected horizontally at their control gates to a word line (WL) to form a page. In MLC, TLC, QLC, and PLC NAND, a page is a set of connected cells that share the same word line and is the minimum unit to program.

As noted above, each NAND cell stores data in the form of the threshold voltage ($V_{th}$) of the transistor. The range of threshold voltages of a of a memory cell is divided into number of regions based on the number of bits stored by the cell and each region corresponds to a value that can be represented by the cell. More specifically, each region corresponds to a charge level and each charge level decodes into a value. As an example, graph 250 illustrates that a SLC NAND flash cell can be at one of two charge levels—L0 or L1. Each charge level decodes into a 1-bit value that is stored in the flash cell (e.g., 0 or 1).

During a read operation, a read reference voltage is applied to cells being read to determine a value of data stored the cells. Only one cell is read at a time per bit line. A pass-through voltage (VPASS) is applied to the remaining cells on the bit line that are not being read to allow the value from the cell being read to propagate to the sense amplifier.

In some instances, a higher pass-through voltage is applied to one or more unread cells that neighbor the cells being read. The higher pass-through voltage may correspond to the pass-through voltage with an additional predetermined offset (e.g., VPASS+Δ).

Typically, the pass-through voltage for a memory device is set at a fixed value (>8V) during manufacturing to ensure sufficient overdrive at end-of-life based on an estimated worst possible overdrive (e.g., based on a number of cycles, block-to-block variation, and die-to-die variation). As a result, there is frequently excessive beginning-of-life read disturb caused by the pass-through voltage, which can be further exacerbated due to die-to-die variations.

To mitigate read disturb, the VPASS adjustment component 113 optimizes the pass-through voltage for the memory device 130. The VPASS adjustment component 113 can optimize the pass-through voltage at time zero (e.g., at manufacturing), dynamically on the fly during operation in the field, or a combination of both. For example, the VPASS adjustment component 113 can determine an initial optimized pass-through voltage setting (defining an initial pass-through voltage) for the memory device 130 at time zero and dynamically optimize the pass-through voltage over the life of the memory device 130. The VPASS adjustment component 113 can also adjust the pass-through voltage on a die-by-die basis to account for die-to-die variations.

The VPASS adjustment component 113 uses a feedback loop to optimize the pass-through voltage. As shown, at operation 210, the VPASS adjustment component 113 performs an assessment of the pass-through voltage for the memory device 130. In performing the assessment, the VPASS adjustment component 113 performs a read operation on one or more pages of the memory device 130. The VPASS adjustment component 113 configures one or more settings for the memory device 130 such that a voltage based on current pass-through voltage settings is applied to all word lines of a page during the read operation. For example, the voltage may correspond to the pass-through voltage defined by the current pass-through voltage setting with an additional offset.

The VPASS adjustment component 113 counts a number of zero bits in the data read form the memory device 130 and compares the number of zero bits with a threshold number of failing bits. If the number of bits exceeds the threshold number of failing bits, the pass-through voltage assessment fails. Otherwise, the assessment passes.

At operation 220, the VPASS adjustment component 113 configures a pass-through voltage setting for the memory device 130 based on a result of the assessment. The pass-through voltage setting controls the pass-through voltage applied to cells in the memory device 130. The pass-through voltage setting specifies a value corresponding to the pass-through voltage. In configuring the pass-through voltage setting, the VPASS adjustment component 113 can increase or decrease the pass-through voltage or maintain the pass-through voltage according to a current setting. The amount by which the VPASS adjustment component 113 increases or decreases the pass-through voltage can be a fixed amount or can vary, for example, based on the number of program/erase cycles of the memory device 130.

For optimizations performed at time zero, if the assessment passes, the VPASS adjustment component 113 decreases the pass-through voltage, at operation 220 (as shown in the example illustrated by the graph 250), and the operation 210 is repeated with the decreased pass-through voltage. If the assessment fails, the VPASS adjustment component 113 reverts to the previous pass-through voltage setting for the memory device 130, at operation 220. In this way, the VPASS adjustment component 113 determines a minimum pass-through voltage that results in a passing assessment to avoid read disturb in the memory device 130 (e.g., the lowest pass-through voltage that results in the number of zero bits in data read from the memory device being below the threshold number of failing bits).

For on the fly dynamic optimizations, the assessment can be run at different program/erase cycles and/or at predetermined cadence of program/erase cycles. If the assessment fails, the VPASS adjustment component 113 increases the pass-through voltage and the operation 210 is repeated with the increased pass-through voltage. If the assessment passes, the VPASS adjustment component 113 maintains the current pass-through voltage setting. Consistent with these embodiments, the VPASS adjustment component 113 performs an initial optimization at time zero to set the pass-through voltage setting according to the minimum pass-through voltage that results in a passing assessment before performing any on the fly dynamic optimizations. In some embodiments, the VPASS adjustment component 113 can forgo performing the initial time zero optimization by decreasing the pass-through voltage in some instances of the dynamic optimizations. For example, if a predetermined threshold number of consecutive passing assessments are reached (e.g., 1000 passing assessments in a row), the VPASS adjustment component 113 can decrease the pass-through voltage thereby allowing the VPASS adjustment component 113 to perform dynamic optimizations without first performing a time zero optimization.

Figure 3:
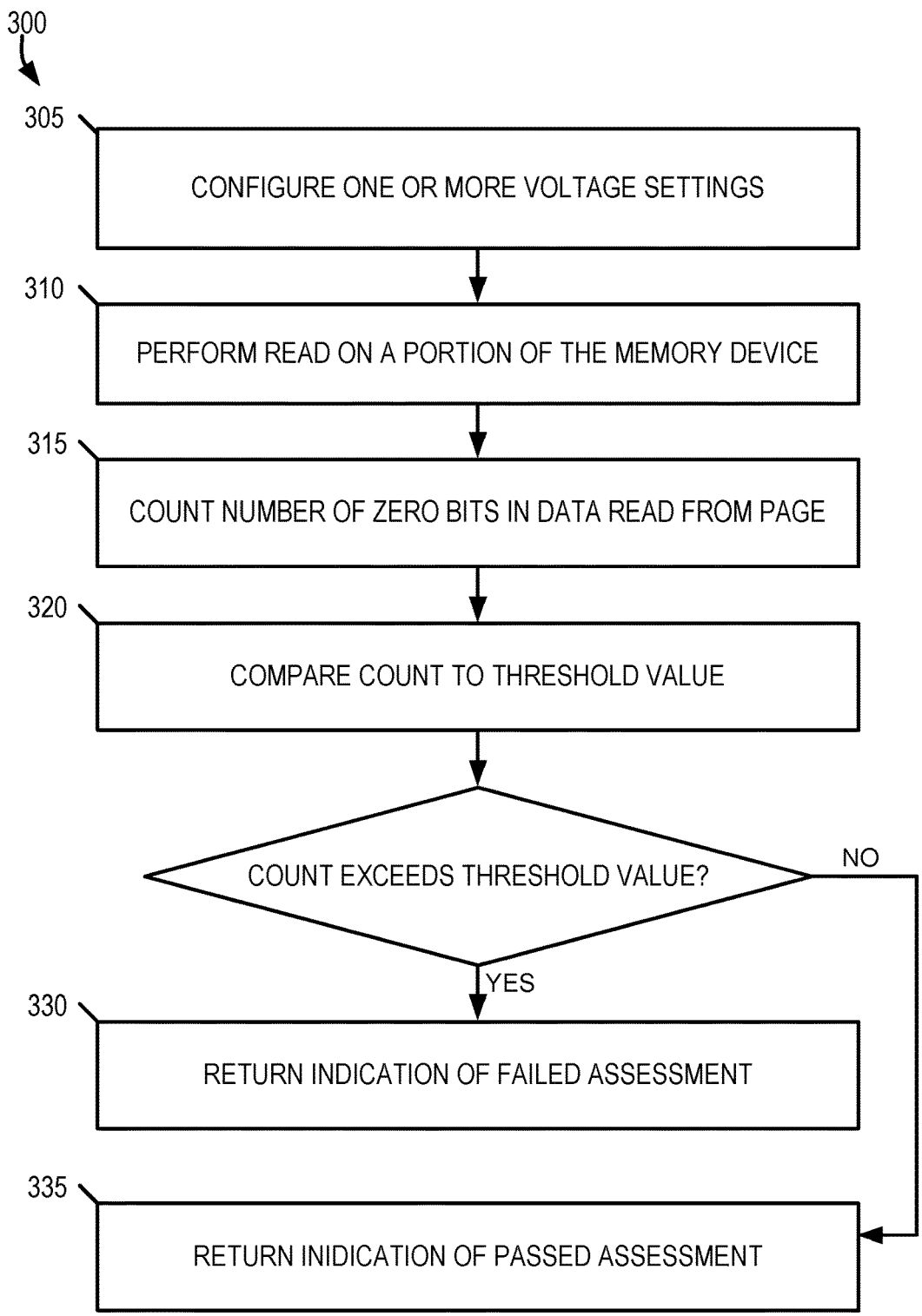
FIG. 3 is a flow diagram illustrating an example method for performing a pass-through voltage assessment on a memory device, in accordance with some embodiments of the present disclosure.

FIG. 3 is a flow diagram illustrating an example method 300 for performing a pass-through voltage assessment on a memory device (e.g., the memory device 130), in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the VPASS adjustment component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 305, the processing device configures one or more voltage settings for the memory device based on a current pass-through voltage setting. The processing device configures the one or more voltage settings for the memory device such that a voltage based on a pass-through voltage specified by the current pass-through voltage setting is applied to all word lines during a read operation performed on a portion of the memory device, at operation 310. In performing the read operation, the processing device may read data from one or more pages of one or more blocks in the memory device. The voltage applied to word lines during the read operation may include the pass-through voltage with an additional offset (e.g., VPASS+Δ).

The processing device counts a number of zero bits in data read from the memory device, at operation 315. Each zero in the data may correspond to a string in the block that did not conduct during the read operation. At operation 320, the processing device compares the number of zero bits with a threshold value corresponding to a number of failing bits. The threshold number of failing bits can be based on a total page size of the memory device and an expected failure rate. For example, assuming an expected failure rate of 0.02% and a page size of 18,344 KB, the threshold number of failing bits can be set at 30 (18,344*8*0.02%) given that at least 29.35 bits per page are expected to fail in a worst case scenario.

If the number of zero bits in the data read from the memory device exceeds the threshold value, the VPASS assessment fails and the processing device returns an indication of a failed assessment, at operation 330. If the number of zero bits does not exceed the threshold value, the VPASS assessment passes and the processing device returns an indication of a passed assessment, at operation 335.

Figure 4:
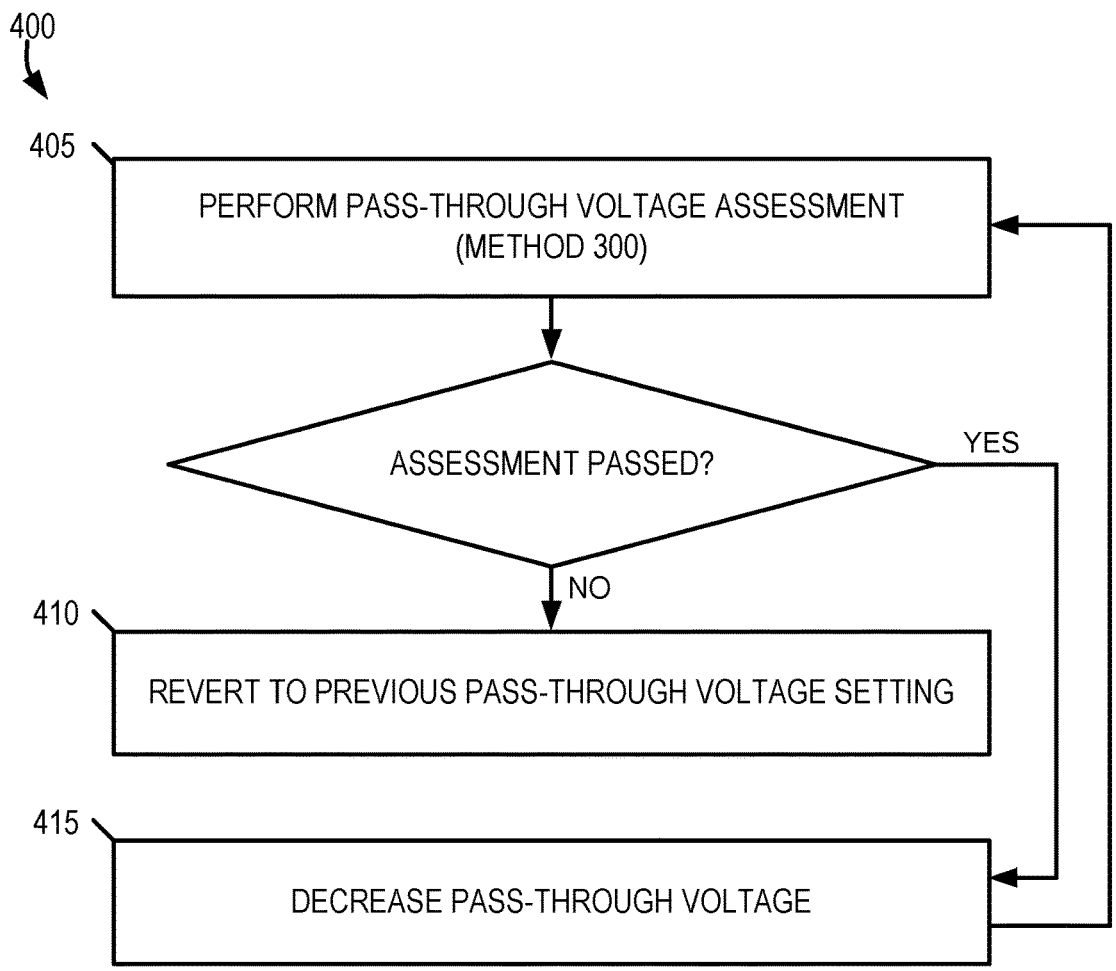
FIG. 4 is a flow diagram illustrating an example method for performing an initial optimization of a pass-through voltage for a memory device, in accordance with some embodiments of the present disclosure.

FIG. 4 is a flow diagram illustrating an example method 400 for performing an initial optimization of a pass-through voltage for a memory device (e.g., the memory device 130), in accordance with some embodiments of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the VPASS adjustment component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 405, the processing devices performs a VPASS assessment on the memory device (method 300) in accordance with a current pass-through voltage setting that defines the pass-through voltage for the memory device. In performing the VPASS assessment, the processing device performs the read operation in accordance with a current pass-through voltage setting that specifies a first value for the pass-through voltage applied to cells during a read operation. In some instances, the current pass-through voltage setting can correspond to a default pass-through voltage set during the manufacturing of the memory device.

If the pass-through voltage assessment fails (e.g., the number of zero bits in the data read from the memory device exceeds the threshold value for failing bits), the processing device, at operation 410, reverts to a previous pass-through voltage setting that specifies a second value for the pass-through voltage. In doing so, the processing device changes the pass-through voltage setting to the second value. The second value is higher than the first value. Thus, in reverting to the previous pass-through voltage setting, the processing device increases the pass-through voltage applied to the memory device during a read operation. In some instances, the previous pass-through voltage corresponds to a default pass-through voltage setting.

If the pass-through voltage assessment passes, the processing device, at operation 415, decreases the pass-through voltage and the method returns to operation 405 where the assessment is repeated using the new (decreased) pass-through voltage. In decreasing the pass-through voltage, the processing device sets the pass-through voltage setting to a third value that is lower than the first value. The amount by which the processing device decreases the pass-through voltage at each iteration can be fixed or can vary, for example, based on the number of program/erase cycles of the memory device.

In repeatedly performing the operations of the method 400 in this manner, the processing device determines a minimum pass-through voltage that results in a passing assessment (e.g., the lowest pass-through voltage that results in the number of zero bits in data read from the memory device being below the threshold number of failing bits).

Figure 5:
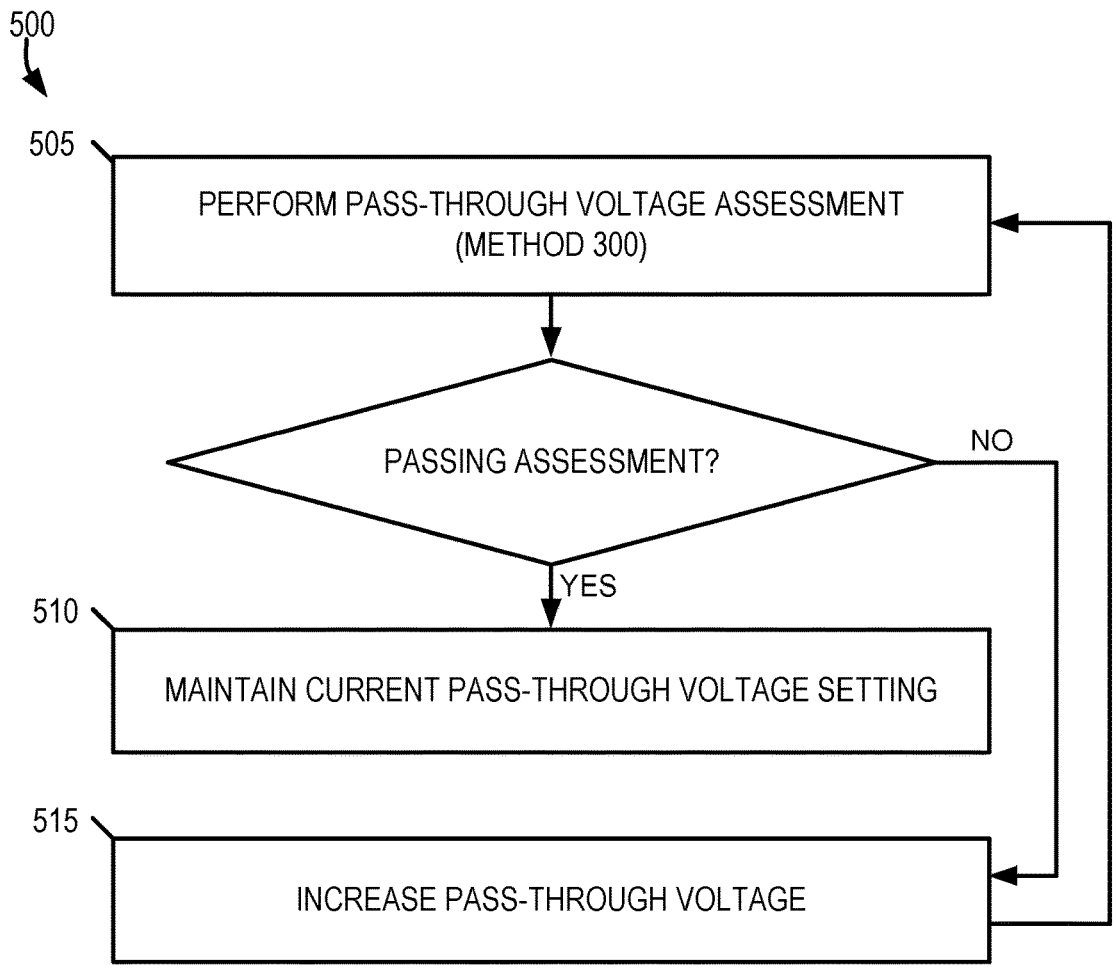
FIG. 5 is a flow diagram illustrating an example method for optimizing a pass-through voltage for a memory device throughout an operational lifecycle of the device, in accordance with some embodiments of the present disclosure.

FIG. 5 is a flow diagram illustrating an example method 500 for optimizing a pass-through voltage for a memory device (e.g., the memory device 130) throughout an operational lifecycle of the device, in accordance with some embodiments of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the VPASS adjustment component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 505, the processing devices performs a VPASS assessment on a memory device (method 300) in accordance with a current pass-through voltage setting that defines the pass-through voltage for the memory device. In performing the VPASS assessment, the processing device performs the read operation in accordance with a current pass-through voltage setting that specifies a first value for the pass-through voltage applied to cells during a read operation. In some instances, the current pass-through voltage setting corresponds to a default pass-through voltage setting. In some instances, the current pass-through voltage setting is based on an optimization performed at time zero (e.g., the method 400) or an optimization performed in a prior iteration of the method 500.

If the pass-through voltage assessment passes, the processing device, at operation 510, maintains the current pass-through voltage setting. That is, if the number of zeros in the data read from the memory device does not exceed the threshold number of failing bits, the processing device does not adjust the pass-through voltage setting.

If the pass-through voltage assessment fails (e.g., the number of zero bits in the data read from the memory device exceeds the threshold value for failing bits), the processing device, at operation 515, increases the pass-through voltage for the memory device and the method returns to operation 505 where the assessment is performed using the new (increased) pass-through voltage. In increasing the pass-through voltage, the processing device adjusts the pass-through voltage setting to a second value that is higher than the first value. The processing device increases the pass-through voltage to compensate for cycle degradation in the memory device.

Figure 6:
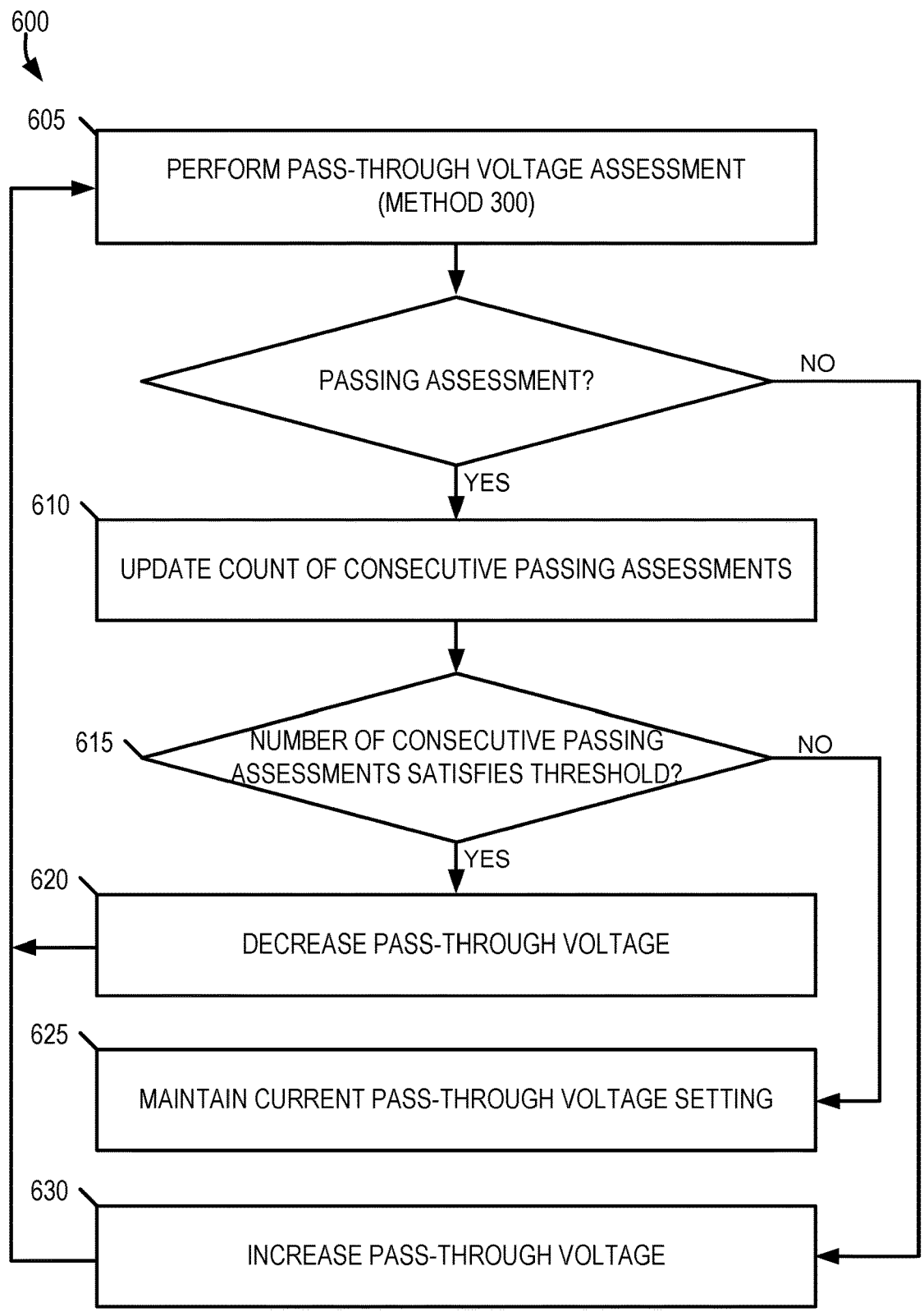
FIG. 6 is a flow diagram illustrating an example method for optimizing a pass-through voltage for a memory device throughout an operational lifecycle of the device, in accordance with some embodiments of the present disclosure.

FIG. 6 is a flow diagram illustrating an example method 600 for optimizing a pass-through voltage for a memory device (e.g., the memory device 130) throughout an operational lifecycle of the device, in accordance with some embodiments of the present disclosure. The method 600 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 600 is performed by the VPASS adjustment component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 605, the processing devices performs a VPASS assessment on a memory device (method 300) in accordance with a current pass-through voltage setting that defines the pass-through voltage for the memory device. In performing the VPASS assessment, the processing device performs the read operation in accordance with a current pass-through voltage setting that specifies a first value for the pass-through voltage applied to cells during a read operation.

In an initial iteration of the method 600, the processing device may utilize a pass-through voltage that is lower than a pass-through voltage set during manufacturing of the memory device. Thus, prior to performing the VPASS assessment, the processing device may adjust the pass-through voltage setting to lower the pass-through voltage relative to a pass-through voltage established during manufacturing. In some instances, the pass-through voltage established during manufacturing is based on a default pass-through voltage setting. In some instances, the pass-through voltage established during manufacturing can be based on an optimization performed at time zero (e.g., the method 400).

If the pass-through voltage assessment passes, the processing device, at operation 610, updates a count of consecutive passing assessments based on the passing of the pass-through voltage assessment performed at operation 605. The processing device determines whether the count of consecutive passing assessments satisfies a threshold constraint that defines a threshold number of consecutive passing assessments, at operation 615.

If the count of consecutive passing assessments exceeds the threshold number of consecutive passing assessments, the processing device decreases the pass-through voltage (e.g., by adjusting the pass-through voltage setting), at operation 620, and the method returns to operation 605 where the assessment is performed using the new (decreased) pass-through voltage.

Otherwise, the processing device maintains the current pass-through voltage setting, at operation 625. That is, if the assessment passes and the number of consecutive passing assessments does not satisfy the threshold, the processing device does not adjust the pass-through voltage setting.

If the pass-through voltage assessment performed at operation 605 fails (e.g., the number of zero bits in the data read from the memory device exceeds the threshold value for failing bits), the processing device, at operation 630, increases the pass-through voltage for the memory device and the method returns to operation 605 where the assessment is performed using the new (increased) pass-through voltage. In increasing the pass-through voltage, the processing device adjusts the pass-through voltage setting to a second value that is higher than the first value.

The amount by which the processing device increases or decreases the pass-through voltage at each iteration of either method 500 or 600 can be fixed or can vary, for example, based on the number of program/erase cycles of the memory device. Further, the rate at which the processing device repeats either of the methods 500 or 600 can be a fixed rate or can vary based on the number of program/erase cycles of the memory device. For example, the rate can be decreased as additional program/erase cycles are performed. As another example, the can be based on a number of failing bits in the successive read during optimization.

Although the methods 400, 500, and 600 are shown and described separately, it shall be appreciated that the operations of any two or more of the methods 400, 500, and 600 can be combined and performed as a single method. For example, the processing device can perform method 400 at time zero to determine an initial optimized pass-through voltage setting for the memory device and repeatedly perform the method 500 to dynamically optimize the pass-through voltage setting over the lifecycle of the memory device. In instances in which the processing device performs the operations of the method 400 at time zero, the processing device may iteratively perform the method 500 over the life cycle of the device to compensate for the cycle degradation by increasing VPASS. Similarly, in instances in which the processing device performs the method 600, the processing device can avoid performing the method 400.

Described implementations of the subject matter can include one or more features, alone or in combination as illustrated below by way of example.

Example 1 is a system including: a memory device; and a processing device coupled to the memory device, the processing device configured to perform operations including: performing a first read operation on the memory device in accordance with a pass-through voltage setting that defines a pass-through voltage applied to one or more cells of the memory device during read operations; counting a first number of zero bits read from the memory device based on the first read operation; comparing the first number of zero bits read from the memory device with a threshold value; and based on the first number of zero bits exceeding the threshold value, increasing the pass-through voltage by adjusting the pass-through voltage setting.

Example 2 includes the system of Example 1, wherein the operations further include determining an initial pass-through voltage setting prior to performing the first read operation.

Example 3 includes the system of any one or more of Examples 1 or 2, wherein determining the initial pass-through voltage setting includes determining a minimum pass-through voltage that results in a passing number of zero bits being read from the memory device, the passing number of zero bits being below the threshold value.

Example 4 includes the system of any one or more of Examples 1-3, wherein: the initial pass-through voltage setting specifies a first value for the pass-through voltage; the determining of the minimum pass-through voltage includes: performing a second read operation on the memory device using a second value for pass-through voltage; counting a second number of zero bits read from the memory device based on the second read operation; and based on the second number of zero bits being below the threshold value, decreasing the pass-through voltage to a third value.

Example 5 includes the system of any one or more of Examples 1-4, wherein the operations further include: performing a third read operation on the memory device using the third value for pass-through voltage; counting a third number of zero bits read from the memory device based on the third read operation; and based on the third number of zero bits being exceeding the threshold value, setting the pass-through voltage to the second value.

Example 6 includes the system of any one or more of Examples 1-5, wherein the second value corresponds to a default value for the pass-through voltage.

Example 7 includes the system of any one or more of Examples 1-6, wherein increasing the pass-through voltage includes adjusting the pass-through voltage setting, the adjusting of the pass-through voltage setting resulting in an adjusted pass-through voltage setting.

Example 8 includes the system of any one or more of Examples 1-7, wherein: the operations further include: performing a second read operation on the memory device in accordance with the adjusted pass-through voltage setting; counting a second number of zero bits read from the memory device based on the second read operation; and based on the second number of zero bits falling below the threshold value, maintaining the pass-through voltage in accordance with the adjusted pass-through voltage setting.

Example 9 includes the system of any one or more of Examples 1-8, wherein the operations further include: performing a second read operation on the memory device in accordance with the adjusted pass-through voltage setting; counting a second number of zero bits read from the memory device based on the second read operation; determining a threshold number of consecutive passing results has been satisfied based on the second number of zero bits falling below the threshold value; and decreasing the pass-through voltage based on determining the threshold number of consecutive passing results has been satisfied.

Example 10 includes the system of any one or more of Examples 1-9, wherein the threshold value corresponds to a number of failing bits and is based on a page size of the memory device.

Example 11 is a method including: performing a first read operation on a memory device in accordance with a pass-through voltage setting that defines a pass-through voltage applied to one or more cells of the memory device during read operations; counting, by a processing device, a first number of zero bits read from the memory device based on the first read operation; comparing, by the processing device, the first number of zero bits read from the memory device with a threshold value; and based on the first number of zero bits exceeding the threshold value, increasing, by the processing device, the pass-through voltage by adjusting the pass-through voltage setting.

Example 12 includes the method of Examples 11 and further includes determining an initial pass-through voltage setting prior to performing the first read operation.

Example 13 includes the method of any one or more of Examples 11 or 12, wherein determining the initial pass-through voltage setting includes determining a minimum pass-through voltage that results in a passing number of zero bits being read from the memory device, the passing number of zero bits being below the threshold value.

Example 14 includes the method of any one or more of Examples 11-13 wherein: the initial pass-through voltage setting specifies a first value for the pass-through voltage; the determining of the minimum pass-through voltage includes: performing a second read operation on the memory device using a second value for pass-through voltage; counting a second number of zero bits read from the memory device based on the second read operation; and based on the second number of zero bits being below the threshold value, decreasing the pass-through voltage to a third value.

Example 15 includes the method of any one or more of Examples 11-14 and further includes performing a third read operation on the memory device using the third value for pass-through voltage; counting a third number of zero bits read from the memory device based on the third read operation; and based on the third number of zero bits being exceeding the threshold value, setting the pass-through voltage to the second value.

Example 16 includes the method of any one or more of Examples 11-15 wherein the second value corresponds to a default value for the pass-through voltage.

Example 17 includes the method of any one or more of Examples 11-16 wherein increasing the pass-through voltage includes adjusting the pass-through voltage setting, the adjusting of the pass-through voltage setting resulting in an adjusted pass-through voltage setting.

Example 18 includes the method of any one or more of Examples 11-17 and further includes: performing a second read operation on the memory device in accordance with the adjusted pass-through voltage setting; counting a second number of zero bits read from the memory device based on the second read operation; and based on the second number of zero bits falling below the threshold value, maintaining the pass-through voltage in accordance with the adjusted pass-through voltage setting.

Example 19 includes the method of any one or more of Examples 11-18 and includes: performing a second read operation on the memory device in accordance with the adjusted pass-through voltage setting; counting a second number of zero bits read from the memory device based on the second read operation; determining a threshold number of consecutive passing results has been satisfied based on the second number of zero bits falling below the threshold value; and decreasing the pass-through voltage based on determining the threshold number of consecutive passing results has been satisfied.

Example 20 is a computer-readable storage medium including instructions that, when executed by a processing device, configure the processing device to perform operations including: performing a read operation on a memory device in accordance with a pass-through voltage setting that defines a pass-through voltage applied to one or more cells of the memory device during read operations; counting a number of zero bits read from the memory device based on the first read operation; comparing the number of zero bits read from the memory device with a threshold value; and based on the number of zero bits exceeding the threshold value, increasing the pass-through voltage by adjusting the pass-through voltage setting.

Figure 7:
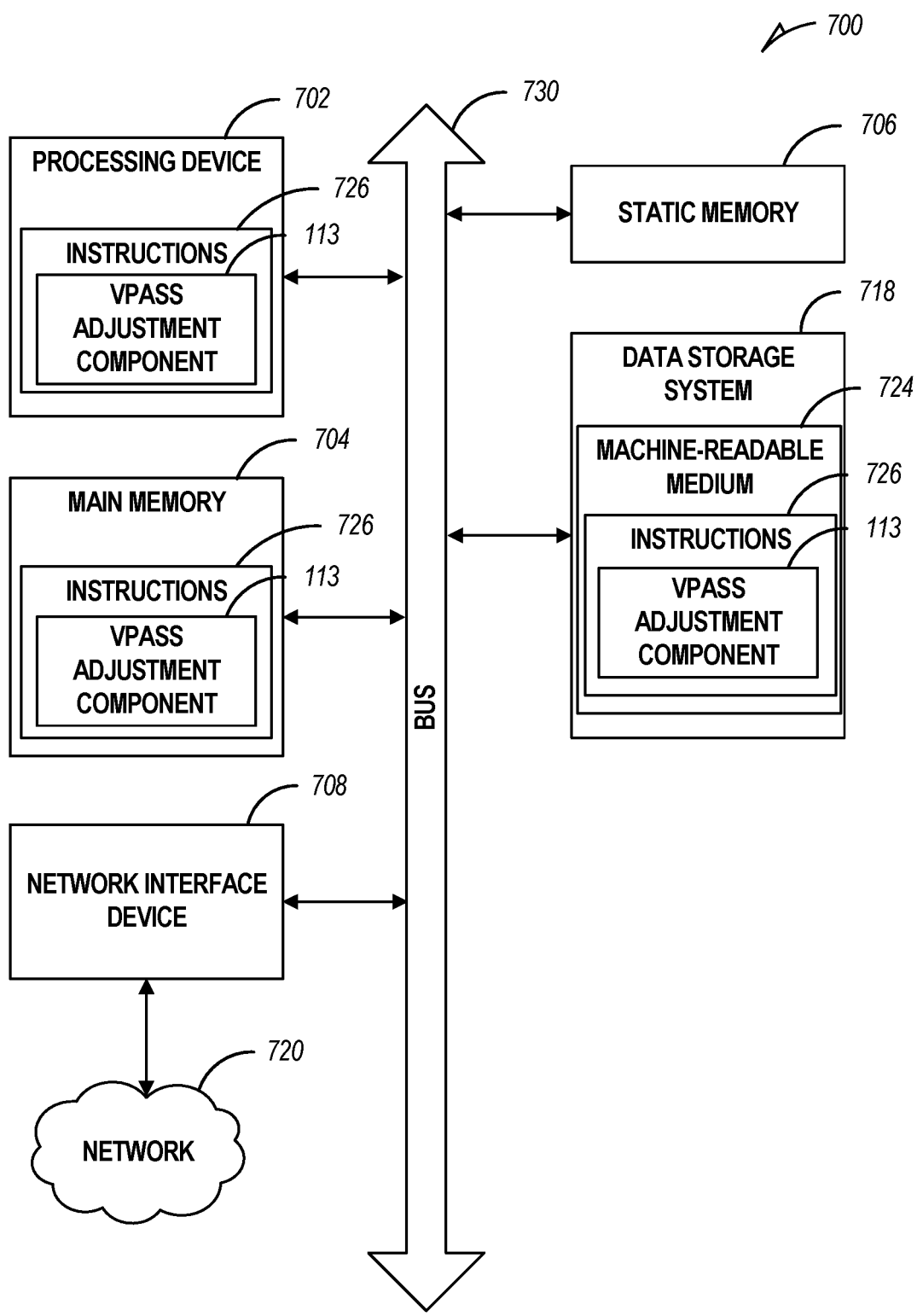
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the VPASS adjustment component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., ROM, flash memory, DRAM such as SDRAM or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device 702 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an ASIC, a FPGA, a digital signal processor (DSP), network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a security component (e.g., the VPASS adjustment component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device coupled to the memory device, the processing device configured to perform operations comprising:
performing a first read operation on the memory device in accordance with a pass-through voltage setting that defines a pass-through voltage applied to one or more cells of the memory device during read operations, the performing of the first read operation comprising applying the pass-through voltage to all word lines in a page of the memory device;
counting a first number of zero bits read from the page of the memory device based on the first read operation;
comparing the first number of zero bits read from the page of the memory device with a threshold number of failing bits, the threshold number of failing bits being based on a page size of the memory device and an expected failure rate of cells of the memory device; and
based on the first number of zero bits read from the page of the memory device exceeding the threshold number of failing bits, increasing the pass-through voltage applied to one or more cells of the memory device during read operations by adjusting the pass-through voltage setting.

2. The system of claim 1, wherein the operations further comprise:
prior to performing the first read operation, determining an initial pass-through voltage setting.

3. The system of claim 2, wherein determining the initial pass-through voltage setting comprises determining a minimum pass-through voltage that results in a passing number of zero bits being read from the page of the memory device, the passing number of zero bits being below the threshold number of failing bits.

4. The system of claim 3, wherein:
the initial pass-through voltage setting specifies a first value for the pass-through voltage; and
the determining of the minimum pass-through voltage comprises:
performing a second read operation on the memory device using a second value for pass-through voltage;
counting a second number of zero bits read from the page of the memory device based on the second read operation; and
based on the second number of zero bits read the page of the memory device being below the threshold number of failing bits, decreasing the pass-through voltage to a third value.

5. The system of claim 4, wherein the operations further comprise:
performing a third read operation on the memory device using the third value for pass-through voltage;
counting a third number of zero bits read from the page of the memory device based on the third read operation; and
based on the third number of zero bits read from the page of the memory device exceeding the threshold number of failing bits, setting the pass-through voltage to the second value.

6. The system of claim 4, wherein the second value corresponds to a default value for the pass-through voltage.

7. The system of claim 1, wherein increasing the pass-through voltage comprises adjusting the pass-through voltage setting, the adjusting of the pass-through voltage setting resulting in an adjusted pass-through voltage setting.

8. The system of claim 1, wherein:
the operations further comprise:
performing a second read operation on the memory device in accordance with the adjusted pass-through voltage setting;
counting a second number of zero bits read from the page of the memory device based on the second read operation; and
based on the second number of zero bits read from the page of the memory device falling below the threshold number of failing bits, maintaining the pass-through voltage in accordance with the adjusted pass-through voltage setting.

9. The system of claim 1, wherein the operations further comprise:
performing a second read operation on the memory device in accordance with the adjusted pass-through voltage setting;

counting a second number of zero bits read from the page of the memory device based on the second read operation;

determining a threshold number of consecutive passing results has been satisfied based on the second number of zero bits read from the page of the memory device falling below the threshold number of failing bits; and decreasing the pass-through voltage based on determining the threshold number of consecutive passing results has been satisfied.

10. The system of claim 1, wherein the expected failure rate comprise a number of bits per page that are expected to fail.

11. A method comprising:

performing a first read operation on the memory device in accordance with a pass-through voltage setting that defines a pass-through voltage applied to one or more cells of the memory device during read operations, the performing of the first read operation comprising applying the pass-through voltage to all word lines in a page of the memory device;

counting a first number of zero bits read from the page of the memory device based on the first read operation;

comparing the first number of zero bits read from the page of the memory device with a threshold number of failing bits, the threshold number of failing bits being based on a page size of the memory device and an expected failure rate of cells of the memory device; and based on the first number of zero bits read from the page of the memory device exceeding the threshold number of failing bits, increasing the pass-through voltage applied to one or more cells of the memory device during read operations by adjusting the pass-through voltage setting.

12. The method of claim 11, further comprising:

prior to performing the first read operation, determining an initial pass-through voltage setting.

13. The method of claim 12, wherein determining the initial pass-through voltage setting comprises determining a minimum pass-through voltage that results in a passing number of zero bits being read from the page of the memory device, the passing number of zero bits being below the threshold number of failing bits.

14. The method of claim 13, wherein:

the initial pass-through voltage setting specifies a first value for the pass-through voltage; and the determining of the minimum pass-through voltage comprises:

performing a second read operation on the memory device using a second value for pass-through voltage;

counting a second number of zero bits read from the page of the memory device based on the second read operation; and based on the second number of zero bits read from the page of the memory device being below the threshold number of failing bits, decreasing the pass-through voltage to a third value.

15. The method of claim 14, further comprising:

performing a third read operation on the memory device using the third value for pass-through voltage;

counting a third number of zero bits read from the page of the memory device based on the third read operation; and based on the third number of zero bits read from the page of the memory device exceeding the threshold number of failing bits, setting the pass-through voltage to the second value.

16. The method of claim 14, wherein the second value corresponds to a default value for the pass-through voltage.

17. The method of claim 11, wherein increasing the pass-through voltage comprises adjusting the pass-through voltage setting, the adjusting of the pass-through voltage setting resulting in an adjusted pass-through voltage setting.

18. The method of claim 11, further comprising:

performing a second read operation on the memory device in accordance with the adjusted pass-through voltage setting;

counting a second number of zero bits read from the page of the memory device based on the second read operation; and based on the second number of zero bits read from the page of the memory device falling below the threshold number of failing bits, maintaining the pass-through voltage in accordance with the adjusted pass-through voltage setting.

19. The method of claim 11, further comprising:

performing a second read operation on the memory device in accordance with the adjusted pass-through voltage setting;

counting a second number of zero bits read from in the page of the memory device based on the second read operation;

determining a threshold number of consecutive passing results has been satisfied based on the second number of zero bits read from the page of the memory device falling below the threshold number of failing bits; and decreasing the pass-through voltage based on determining the threshold number of consecutive passing results has been satisfied.

20. A non-transitory computer-readable storage medium comprising instructions that, when executed by a processing device, configured the processing device to perform operation comprising:

performing a read operation on the memory device in accordance with a pass-through voltage setting that defines a pass-through voltage applied to one or more cells of the memory device during read operations, the performing of the read operation comprising applying the pass-through voltage to all word lines in a page of the memory device;

counting a number of zero bits read from the page of the memory device based on the read operation;

comparing the number of zero bits read from the page of the memory device with a threshold number of failing bits, the threshold number of failing bits being based on a page size of the memory device and an expected failure rate of cells of the memory device; and based on the number of zero bits read from the page of the memory device exceeding the threshold number of failing bits, increasing the pass-through voltage applied to one or more cells of the memory device during read operations by adjusting the pass-through voltage setting.

* * * * *